(12) United States Patent
Toda

(10) Patent No.: US 6,605,995 B2
(45) Date of Patent: Aug. 12, 2003

(54) DIFFERENTIAL AMPLIFIER CIRCUIT

(75) Inventor: Shuji Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/038,650

(22) Filed: Jan. 8, 2002

(65) Prior Publication Data

US 2002/0121932 A1 Sep. 5, 2002

(30) Foreign Application Priority Data

Jan. 12, 2001 (JP) .......................................... 2001-005346

(51) Int. Cl.[7] ................................................. H03F 3/45
(52) U.S. Cl. ....................................... 330/252; 330/253
(58) Field of Search ................................. 330/252, 253; 327/307, 333

(56) References Cited

U.S. PATENT DOCUMENTS 5,831,480 A    11/1998   Kato et al. .................. 330/253
6,114,906 A  *  9/2000   Fukui ......................... 330/252

* cited by examiner

Primary Examiner—Steven J. Mottola
(74) Attorney, Agent, or Firm—Oblon, Spivak, McClelland, Maier & Neustadt, P.C.

(57) ABSTRACT

Externally input voltages IN(−) and IN(+) are input to the input terminal of a differential amplifier unit (1) not directly, but after being shifted by voltage shift units (2, 3). The input voltages IN(−) and IN(+) are decreased by α when they are at high level, and by β when they are at low level. In this case, α>β. The voltage difference of the external input voltage IN between high and low levels is relatively reduced, and then the external input voltage IN is input to the differential amplifier unit (1). This widens the substantial in-phase input voltage range in the differential amplifier unit (1).

11 Claims, 4 Drawing Sheets

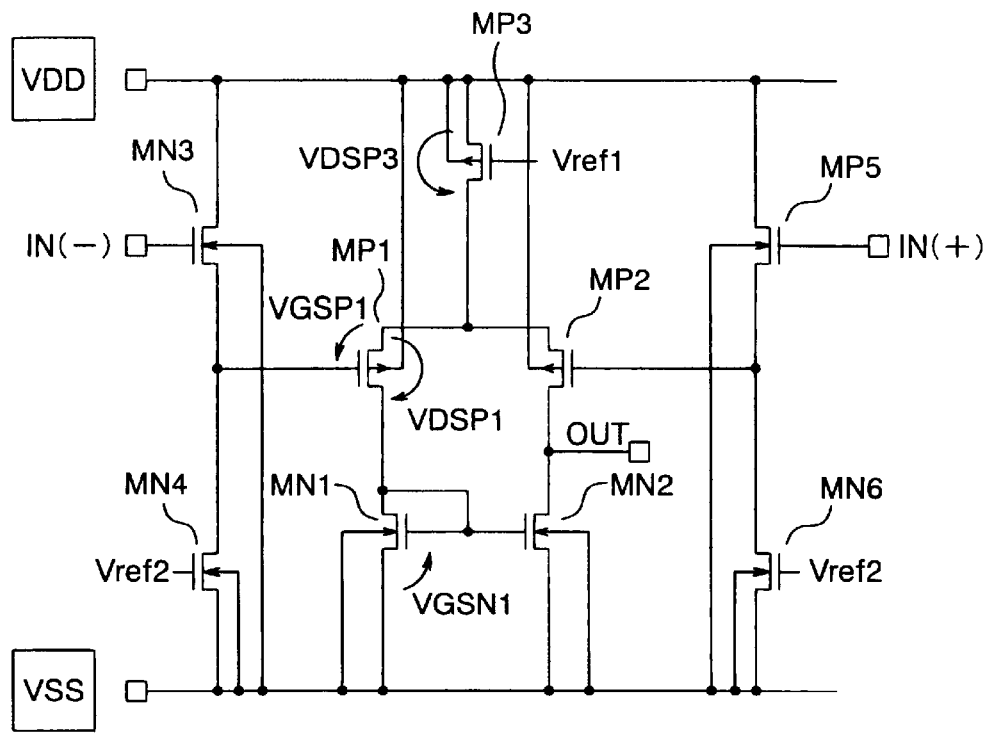
F I G. 2
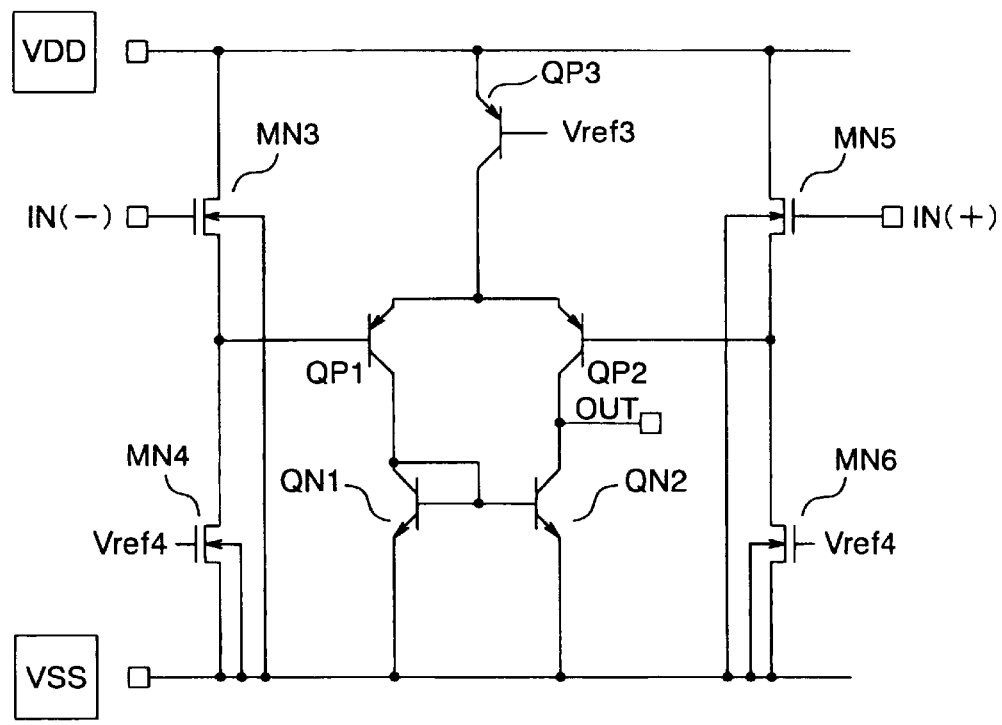
F I G. 3

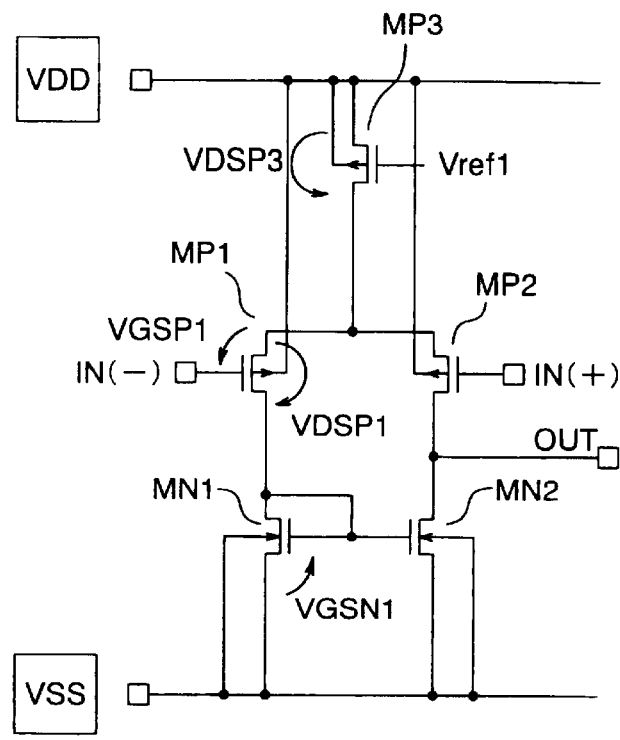
F I G. 4
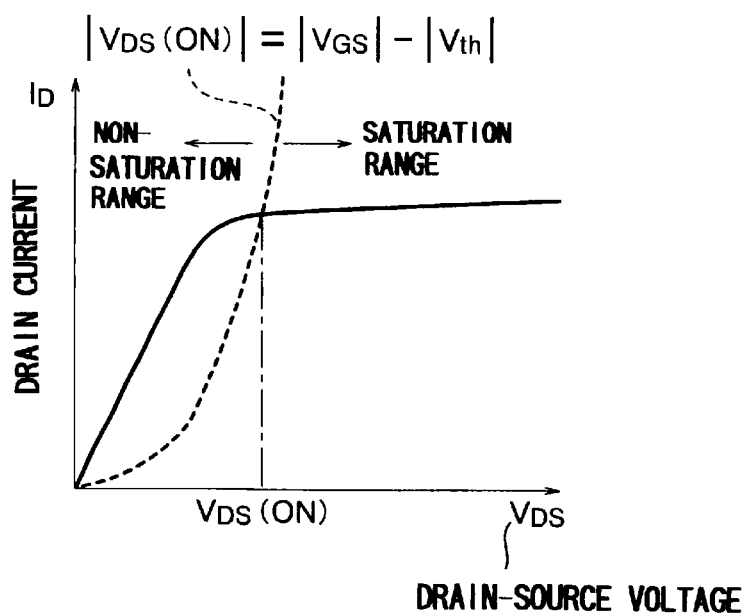
F I G. 5

DIFFERENTIAL AMPLIFIER CIRCUIT

CROSS REFERENCE TO RELATED APPLICATION

This application claims benefit of priority under 35 USC 119 to Japanese Patent Application No. 2001-5346, filed on Jan. 12, 2001, the entire contents of which are incorporated by reference herein.

BACKGROUND OF THE INVENTION

The present invention relates to a differential amplifier circuit.

A differential amplifier circuit is used to amplify a voltage difference between two signals. The average of the voltages of two signals is called an in-phase input voltage, and the range of in-phase input voltages within which the differential amplifier circuit can normally operate is called an in-phase input voltage range. The differential amplifier circuit is more convenient with higher performance in a wider in-phase input voltage range.

FIG. 4 shows an example of a differential amplifier circuit concerning the present invention. The source and back gate of a P-channel MOS transistor MP3 are connected as a current source to a first power supply terminal VDD, and its gate receives a reference voltage Vref1.

The drain of the transistor MP3 is connected to the sources of P-channel MOS transistors MP1 and MP2; and its back gate, to the first power supply terminal VDD. The gate of the transistor MP1 is connected to an input terminal IN(−); and that of the transistor MP2, to an input terminal IN(+).

The drain and gate of an N-channel MOS transistor MN1 are connected to the drain of the transistor MP1; and its source and back gate, to a second power supply terminal VSS. The drain of an N-channel MOS transistor MN2 is connected to that of the transistor MP2; its gate, to the gate and drain of the transistor MN1; and its source and back gate, to the second power supply terminal VSS.

Voltages, currents, and the like when the transistors MP1 to MP3, MN1, and MN2 are generically called a transistor MXK will be called as follows:
VGSXK: gate-source voltage of MXK
VDSXK: drain-source voltage of MXK
IDXK: drain current of MXK
μSXK: mobility of MXK
WXK: gate width of MXK
LXK: gate length of MXK
VthXK: threshold voltage of MXK An in-phase input voltage CMVIN in this differential amplifier circuit is calculated from a "second power supply terminal VSS→transistor MN1→transistor MP1→input terminal IN(−)" path:

$$CMVIN = VSS + VGSN1 + |VDSP1| - VGSP1| \quad (1)$$

As the input voltage is decreased, |VDSP1| decreases. The case wherein the operating point of the transistor MP1 coincides with the boundary between a saturation range and a non-saturation range can be regarded as a lower limit value CMVIN(L)1 of the in-phase input voltage range.

Assuming that the drain-source voltage VDS of the transistor MP1 at this time be an ON voltage VDS(ON)P1, we have $$|VDS(ON)P1| = |VGS| - |Vth| \quad (2)$$

as shown in FIG. 5.

Substituting equation (2) into equation (1) yields $$CMVIN(L)1 = VSS + VGSN1 + |VDS(ON)P1| - |VGSP1| \quad (3)$$

$$CMVIN(L)1 = VSS + VGSN1 - |VthP1| \quad (4)$$

On the other hand, a MOS transistor which operates in the saturation range satisfies $$VGS = (2ID/\mu S * C0X * (W/L))^{1/2} + Vth \quad (5)$$

where ID: drain current, μS: mobility, C0X: gate capacitance, W: gate width, and L: gate length.

The transistor MN1 always operates in the saturation range because the gate and drain voltages are the same. Substituting equation (5) into equation (4) yields the lower limit value CMVIN(L)1 of the final in-phase input voltage range:

$$CMVIN(L)1 = VSS + (2IDN1/\mu SN1 * C0X * (WN1/LN1))^{1/2} + VthN1 - |VthP1| \quad (6)$$

The lower limit value CMVIN is calculated from a "first power supply terminal VDD→transistor MP3→transistor MP1→input terminal IN(−)" path:

$$CMVIN = VDD - |VDSP3| - |VGSP1| \quad (7)$$

As the input voltage is raised, the voltage |VDSP3| decreases. The case wherein the operating point of the transistor MP3 coincides with the boundary between the saturation range and the non-saturation range can be regarded as an upper limit value CMVIN(H)1 of the in-phase input voltage range. This value is given by $$CMVIN(H)1 = VDD - |VDS(ON)P3| - |VGSP1| \quad (8)$$

From equations (2) and (8), the upper limit value CMVIN(H)1 is $$CMVIN(H)1 = VDD - |VGSP3| + |VthP3| - |VGSP1| \quad (9)$$

The operating point of the transistor MP1 is in the saturation range. Equation (5) for the saturation range also holds for MP3 whose operating point is at the boundary. Thus, from equations (5) and (9), the upper limit value CMVIN(H)1 is:

$$CMVIN(H)1 = VDD + (2|IDP3|/(\mu SP3 * C0X * WP3)/LP3))^{1/2} - (2|IDP1|/(\mu SP1 * C0X * WP1)/LP1))^{1/2} - |VthP1| \quad (10)$$

The in-phase input voltage range CMVIN1 is given by $$CMVIN1 = CMVIN(H)1 - CMVIN(L)1 \quad (11)$$

Assuming that the threshold voltages of the P- and N-channel MOS transistors are equal and VthN1=VthP1, the in-phase input voltage range is from CMVIN(H)1 to CMVIN(L)1, as shown in FIG. 6. Near the second power supply voltage VSS or the first power supply voltage VDD out of this range, some transistor operates in the non-saturation range and does not normally operate as a differential amplifier circuit.

The differential amplifier circuit suffers a problem that it cannot normally operate upon reception of a voltage exceeding the in-phase input voltage range given by equation (11).

SUMMARY OF THE INVENTION

A differential amplifier circuit according to an aspect of the present invention comprises a differential amplifier unit which has first and second input terminals and differentially amplifies first and second input signals respectively input to the first and second input terminals, a first voltage shift unit which is connected to a first external input terminal and the first input terminal, decreases the first external input signal by a first voltage when a first external input signal input from the first external input terminal is at high level or decreases the first external input signal by a second voltage smaller than the first voltage when the first external input signal is at low level, and supplies the resultant first external input signal as the first input signal to the first input terminal, and a second voltage shift unit which is connected to a second external input terminal and the second input terminal, decreases the second external input signal by the first voltage when a second external input signal input from the second external input terminal is at high level or decreases the second external input signal by the second voltage when the second external input signal is at low level, and supplies the resultant second external input signal as the second input signal to the second input terminal.

A differential amplifier circuit according to another aspect of the present invention comprises a differential amplifier unit which has first and second input terminals and differentially amplifies first and second input signals respectively input to the first and second input terminals, a first voltage shift unit which is connected to a first external input terminal and the first input terminal, reduces a range of high to low levels of a first external input signal input from the first external input terminal, and supplies the resultant first external input signal as the first input signal to the first input terminal, and a second voltage shift unit which is connected to a second external input terminal and the second input terminal, reduces a range of high to low levels of a second external input signal input from the second external input terminal, and supplies the resultant second external input signal as the second input signal to the second input terminal.

BRIEF DESCRIPTION OF THE DRAWINGS

FIG. 2 is a circuit diagram showing the arrangement of a differential amplifier circuit according to the second embodiment of the present invention;

FIG. 3 is a circuit diagram showing the arrangement of a differential amplifier circuit according to the third embodiment of the present invention;

FIG. 4 is a circuit diagram showing the arrangement of a differential amplifier circuit concerning the present invention;

FIG. 5 is a graph showing the relationship between the drain-source voltage and drain current of a MOSFET.

DESCRIPTION OF THE PREFERRED EMBODIMENTS

Preferred embodiments of the present invention will be described below with reference to the accompanying drawings.

(1) First Embodiment

Figure 1:
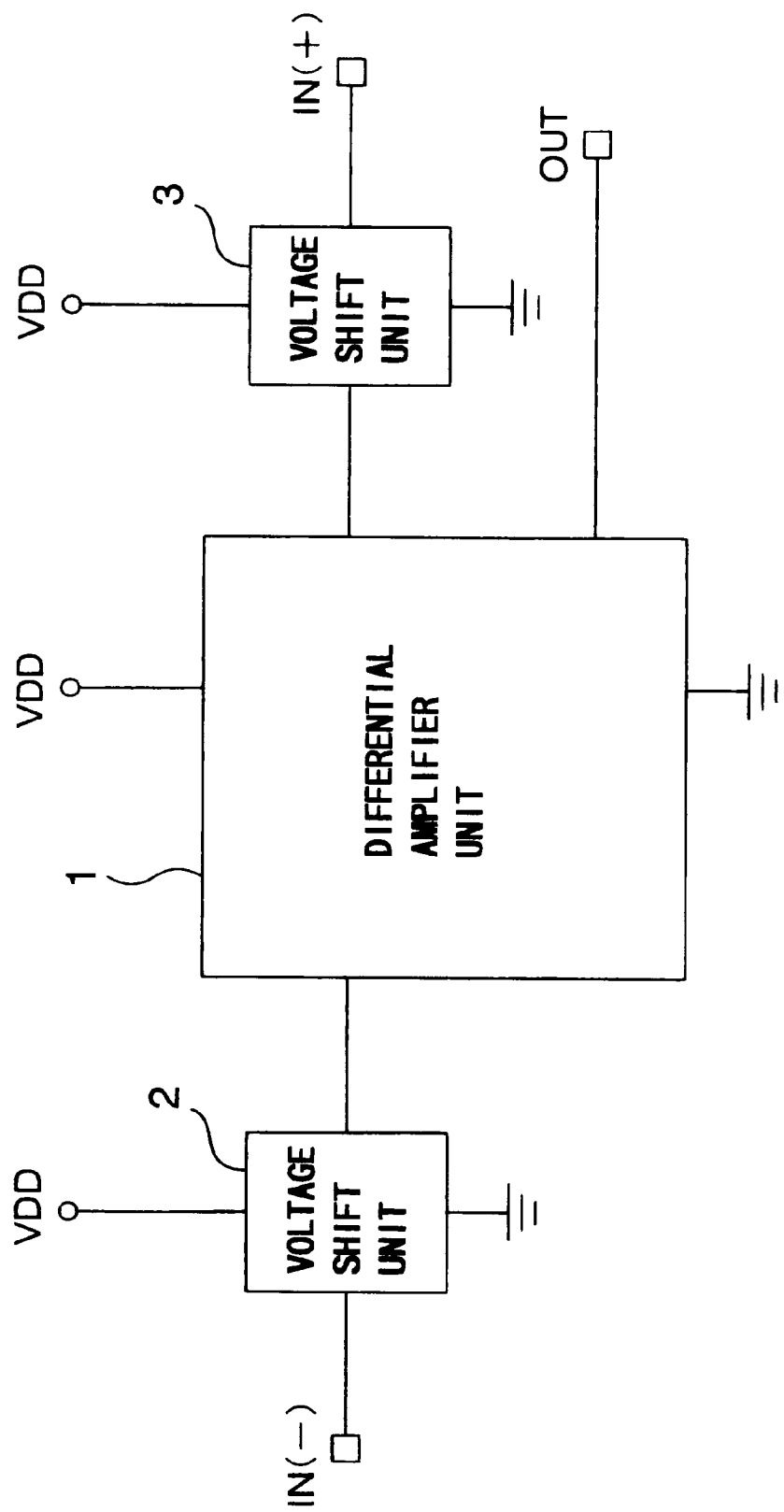
FIG. 1 is a block diagram showing the arrangement of a differential amplifier circuit according to the first embodiment of the present invention.
Figure 6:
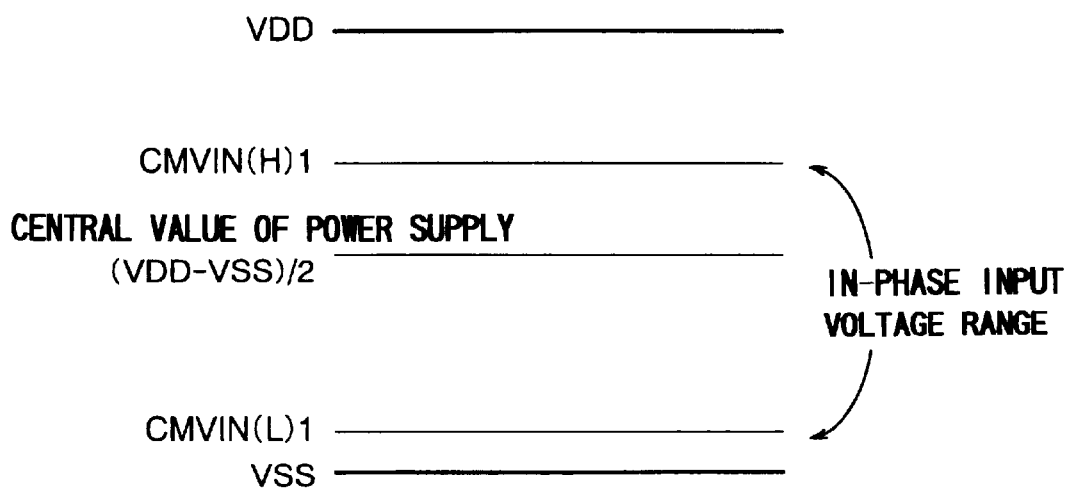
FIG. 6 is a view showing the in-phase input voltage range in the differential amplifier circuit shown in FIG. 4.

FIG. 1 shows the arrangement of a differential amplifier circuit according to the first embodiment of the present invention.

This differential amplifier circuit comprises a differential amplifier unit 1, and voltage shift units 2 and 3. The voltage shift unit 2 outputs a voltage by decreasing it by level $\alpha$ for a high-level voltage IN(−) externally input via an input terminal IN(−), and outputs a voltage by decreasing it by level $\beta$ for a low-level voltage IN(−). Levels $\alpha$ and $\beta$ satisfy $\alpha > \beta$. That is, the voltage shift unit 2 outputs a voltage by reducing by $\alpha - \beta$ the range of the externally input voltage IN(−) between high and low levels.

Similarly, the voltage shift unit 3 outputs a voltage by decreasing it by level $\alpha$ for a high-level voltage IN(+) externally input via an input terminal IN(−), and outputs a voltage by decreasing it by level $\beta$ for a low-level voltage IN(+).

The input voltages IN(−) and IN(+) shifted in this manner are input to the differential amplifier unit 1, which outputs from an output terminal OUT a voltage amplified in correspondence with the difference between the input voltages IN(−) and IN(+).

If the externally input voltages IN(−) and IN(+) are directly input to the differential amplifier unit 1, like the above-mentioned differential amplifier circuit concerning the present invention, the in-phase input voltage range is limited to the one given by equation (11), as described above.

To the contrary, in the first embodiment, a voltage decreased by level $\alpha$ is input to the differential amplifier unit 1 when the externally input voltages IN(−) and IN(+) are at high level. Regarding high level, the differential amplifier unit 1 can cope with a higher external input. When the externally input voltages IN(−) and IN(+) are at low level, a voltage decreased by level $\beta$ is input to the differential amplifier unit 1. This decrease is smaller than $\alpha$, so that the influence on the input width for low level in the differential amplifier unit 1 is smaller than that for high level.

More specifically, according to the first embodiment, the voltage shift units 2 and 3 reduce by $\alpha - \beta$ the ranges of the input voltages IN(−) and IN(+) between high and low levels, and input the resultant voltages to the differential amplifier unit 1. This widens the in-phase input voltage range.

The first embodiment can widen the in-phase input voltage range in comparison with the above-mentioned apparatus concerning the present invention.

(2) Second Embodiment

FIG. 2 shows the arrangement of a differential amplifier circuit according to the second embodiment of the present invention.

The second embodiment exemplifies the arrangement of the first embodiment. A differential amplifier unit 1 comprises transistors MP1 to MP3, MN1, and MN2, similar to the circuit shown in FIG. 4.

A voltage shift unit 2 comprises N-channel MOS transistors MN3 and MN4. The drain of the transistor MN3 is connected to a first power supply terminal VDD; its gate, to an external input terminal IN(−); and its source, to the gate of the transistor MP1 serving as the input terminal of the differential amplifier unit 1. The drain of the transistor MN4 is connected to the gate of the transistor MP1, its gate receives a reference voltage Vref2, and its source is connected to a second power supply terminal VSS. The back gates of both the transistors MN3 and MN4 are connected to the second power supply terminal VSS.

A voltage shift unit 3 comprises N-channel MOS transistors MN5 and MN6. The drain of the transistor MN5 is connected to the first power supply terminal VDD; its gate, to an external input terminal IN(+); and its source, to the gate of the transistor MP2 serving as the input terminal of the differential amplifier unit 1. The drain of the transistor MN6 is connected to the gate of the transistor MP2, its gate receives the reference voltage Vref2, and its source is connected to the second power supply terminal VSS. The back gates of both the transistors MN5 and MN6 are connected to the second power supply terminal VSS.

The transistors MN4 and MN6 flow a predetermined drain current and operate as a constant current source by inputting the reference voltage Vref2 to their gates.

In the second embodiment, the in-phase input voltage CMVIN2 is the sum of an in-phase input voltage CMVIN1 in the circuit shown in FIG. 4 and a gate-source voltage VGSN3 of the transistor MN3 for the external input terminals IN(−) and IN(+). A lower limit value CMVIN(L)2 of the in-phase input voltage range and an upper limit value CMVIN(H)2 of the in-phase input range are given by $$CMVIN(L)2 = CMVIN(L)1 + VGSN3 \tag{12}$$

$$CMVIN(H)2 = CMVIN(H)1 + VGSN3 \tag{13}$$

The in-phase input voltage range shifts upward by the voltage VGSN3, compared to the above-mentioned apparatus concerning the present invention.

The voltage VGSN3 changes between high and low levels of the external input voltages IN(−) and IN(+). The voltage VGSN3 for a high-level external input voltages IN(−) will be first described.

If the external input voltage IN(−) rises, the gate voltage of the transistor MN3 rises. Since the drain current of the transistor MN4 is a constant current, the drain current of the transistor MN3 is also a constant current. The gate-source voltage VGSN3 of the transistor MN3 becomes constant, and the source voltage of the transistor MN3 rises.

The back gate of the transistor MN3 is connected to the second power supply terminal VSS. This widens the potential difference VSBN3 between the back gate and source of the transistor MN3. As a result, a substrate bias effect occurs, and the threshold voltage Vth of the transistor MN3 rises as given:

$$Vth = Vth0 + \gamma((2\Phi f + VSB)^{1/2} - (2\Phi f)^{1/2}) \tag{14}$$

where Vth0 is the threshold voltage for VSB=0, $\Phi f$ is the Fermi level, and $\gamma = 1/(C0X)*(2q\epsilon NA)^{1/2}$ (q: charge, $\epsilon$: permittivity, NA: impurity concentration).

As is apparent from equation (14), the threshold voltage VthN3 (H) for a high-level external input voltage IN(−) rises as the $(VSB)^{1/2}$ value increases. For a low-level external input voltage IN(−), the $(VSB)^{1/2}$ value is small, and the threshold voltage VthN3 (L) hardly rises because of a small rise width of the source potential of the transistor MN3.

From this, the threshold voltage VthN3 (H) of the transistor MN3 for a high-level external input voltage IN(−) (in-phase input voltage is high), and the threshold voltage VthN3 (L) of the transistor MN3 for a low-level external input voltage IN(−) (in-phase input voltage is low) satisfy $$VthN3 (H) > VthN3 (L) \tag{15}$$

This relation holds not only for the transistor MN3 but also for the transistor MP5.

Substituting equation (5) into equations (12) and (13) yields the lower and upper limit values CMVIN(L)2 and CMVIN(H)2 of the in-phase input voltage:

$$CMVIN(L)2 = CMVIN(L)1 + (2IND3/\mu SN3 * C0X * (WN3/LN3))^{1/2} + VthN3 (L) \tag{16}$$

$$CMVIN(H)2 = CMVIN(H)1 + (2IND3/\mu SN3 * C0X * (WN3/LN3))^{1/2} + VthN3 (H) \tag{17}$$

Hence, the in-phase input voltage range CMVIN2 is given by $$\begin{aligned} CMVIN2 &= CMVIN(H)2 - CMVIN(L)2 \\ &= CMVIN(H)1 - CMVIN(L)1 + VthN3(H) - \\ &\quad VthN3(L) \\ &= CMVIN1 + VthN3(H) - VthN3(L) > CMVIN1 \end{aligned} \tag{18}$$

The second embodiment widens the in-phase input voltage range by increases in the threshold voltages Vth of the transistors MN3 and MP5 caused by the substrate bias effect, compared to the differential amplifier circuit shown in FIG. 4.

(3) Third Embodiment

FIG. 3 shows the arrangement of a differential amplifier circuit according to the third embodiment of the present invention.

The third embodiment also exemplifies the arrangement of the first embodiment. The second embodiment uses the MOSFETs MP1 to MP3, MN1, and MN2 to constitute the differential amplifier unit 1, whereas the third embodiment uses bipolar transistors QP1 to QP3, QN1, and QN2.

The emitter of the PNP bipolar transistor QP3 serving as a current source is connected to a first power supply terminal VDD, and its base receives a reference voltage Vref1.

The collector of the transistor QP3 is connected to the emitters of the PNP bipolar transistors QP1 and QP2. The base of the transistor QP1 is connected to an input terminal IN(−); and that of the transistor QP2, to an input terminal IN(+).

The collector and base of the NPN bipolar transistor QN1 are connected to the collector of the transistor QP1; and its emitter, to a second power supply terminal VSS. The collector of the NPN bipolar transistor QN2 is connected to that of the transistor QP2; its base, to the base and collector of the transistor QN1; and its emitter, to the second power supply terminal VSS. The collectors of the transistors QP2 and QN2 are commonly connected to an output terminal OUT.

Also in the third embodiment, the differential amplifier unit operates similarly to the second embodiment. Since voltage shift units 2 and 3 are connected to the bases of the transistors QP1 and QP1, the in-phase input voltage range CMVIN2 is widened as given by equation (18), similar to the second embodiment.

The differential amplifier circuit according to the above-described embodiments becomes more convenient with a larger in-phase input voltage width by connecting voltage shift units to the input terminal of a differential amplifier unit, reducing the voltage width of an externally input voltage between high and low levels, and supplying the resultant voltage to the input terminal of the differential amplifier unit.

The above embodiments are merely examples and do not limit the present invention. For example, the detailed circuit arrangements of the differential amplifier unit and voltage shift unit shown in FIGS. 2 and 3 are merely examples, and can be variously modified as needed.

What is claimed is:

1. A differential amplifier circuit comprising:
   a differential amplifier unit which has first and second input terminals and differentially amplifies first and second input signals respectively input to the first and second input terminals;
   a first voltage shift unit which is connected to a first external input terminal and the first input terminal, decreases the first external input signal by a first voltage when a first external input signal input from the first external input terminal is at high level or decreases the first external input signal by a second voltage smaller than the first voltage when the first external input signal is at low level, and supplies the resultant first external input signal as the first input signal to the first input terminal; and
   a second voltage shift unit which is connected to a second external input terminal and the second input terminal, decreases the second external input signal by the first voltage when a second external input signal input from the second external input terminal is at high level or decreases the second external input signal by the second voltage when the second external input signal is at low level, and supplies the resultant second external input signal as the second input signal to the second input terminal.

2. A circuit according to claim 1, wherein
   said first voltage shift unit comprises
   a first MOSFET having a drain connected to a first power supply terminal, a gate connected to the first external input terminal, and a source connected to the first input terminal, and
   a second MOSFET having a drain connected to the first input terminal, a gate which receives a first predetermined potential, and a source connected to a second power supply terminal,
   said second voltage shift unit comprises
   a third MOSFET having a drain connected to the first power supply terminal, a gate connected to the second external input terminal, and a source connected to the second input terminal, and
   a fourth MOSFET having a drain connected to the second input terminal, a gate which receives the first predetermined potential, and a source connected to the second power supply terminal, and
   back gates of the first, second, third, and fourth MOSFETs are connected to the second power supply terminal.

3. A circuit according to claim 1, wherein said differential amplifier unit comprises
   a current source having one terminal connected to the first power supply terminal,
   a fifth MOSFET having a source connected to the other terminal of the current source, and a gate connected to the first input terminal,
   a sixth MOSFET having a source connected to the other terminal of the current source, and a gate connected to the second input terminal,
   a seventh MOSFET having a drain and gate connected to a drain of the fifth MOSFET, and a source connected to the second power supply terminal, and
   an eighth MOSFET having a drain connected to a drain of the sixth MOSFET, a gate connected to the gate and drain of the seventh MOSFET, and a source connected to the second power supply terminal.

4. A circuit according to claim 1, wherein said differential amplifier unit comprises
   a current source having one terminal connected to the first power supply terminal,
   a first bipolar transistor having an emitter connected to the other terminal of the current source, and a base connected to the first input terminal,
   a second bipolar transistor having an emitter connected to the other terminal of the current source, and a base connected to the second input terminal,
   a third bipolar transistor having a collector and base connected to a collector of the first bipolar transistor, and an emitter connected to the second power supply terminal, and
   a fourth bipolar transistor having a collector connected to a collector of the second bipolar transistor, a base connected to the collector and base of the third bipolar transistor, and an emitter connected to the second power supply terminal.

5. A circuit according to claim 2, wherein said differential amplifier unit comprises
   a current source having one terminal connected to the first power supply terminal,
   a fifth MOSFET having a source connected to the other terminal of the current source, and a gate connected to the first input terminal,
   a sixth MOSFET having a source connected to the other terminal of the current source, and a gate connected to the second input terminal,
   a seventh MOSFET having a drain and gate connected to a drain of the fifth MOSFET, and a source connected to the second power supply terminal, and
   an eighth MOSFET having a drain connected to a drain of the sixth MOSFET, a gate connected to the gate and drain of the seventh MOSFET, and a source connected to the second power supply terminal.

6. A circuit according to claim 2, wherein said differential amplifier unit comprises
   a current source having one terminal connected to the first power supply terminal,
   a first bipolar transistor having an emitter connected to the other terminal of the current source, and a base connected to the first input terminal,
   a second bipolar transistor having an emitter connected to the other terminal of the current source, and a base connected to the second input terminal,
   a third bipolar transistor having a collector and base connected to a collector of the first bipolar transistor, and an emitter connected to the second power supply terminal, and
   a fourth bipolar transistor having a collector connected to a collector of the second bipolar transistor, a base connected to the collector and base of the third bipolar transistor, and an emitter connected to the second power supply terminal.

7. A differential amplifier circuit comprising:
   a differential amplifier unit which has first and second input terminals and differentially amplifies first and second input signals respectively input to the first and second input terminals;

a first voltage shift unit which is connected to a first external input terminal and the first input terminal, reduces a range of high to low levels of a first external input signal input from the first external input terminal, and supplies the resultant first external input signal as the first input signal to the first input terminal; and a second voltage shift unit which is connected to a second external input terminal and the second input terminal, reduces a range of high to low levels of a second external input signal input from the second external input terminal, and supplies the resultant second external input signal as the second input signal to the second input terminal, wherein said first voltage shift unit comprises:
 a first MOSFET having a drain connected to a first power supply terminal, a gate connected to the first external input terminal, and a source connected to the first input terminal, and
 a second MOSFET having a drain connected to the first input terminal, a gate which receives a first predetermined potential, and a source connected to a second power supply terminal, wherein said second voltage shift unit comprises:
 a third MOSFET having a drain connected to the first power supply terminal, a gate connected to the second external input terminal, and a source connected to the second input terminal, and
 a fourth MOSFET having a drain connected to the second input terminal, a gate which receives the first predetermined potential, and a source connected to the second power supply terminal, and wherein back gates of the first, second, third, and fourth MOSFETs are connected to the second power supply terminal.

8. A differential amplifier circuit comprising:
a differential amplifier unit which has first and second input terminals and differentially amplifies first and second input signals respectively input to the first and second input terminals;

a first voltage shift unit which is connected to a first external input terminal and the first input terminal, reduces a range of high to low levels of a first external input signal input from the first external input terminal, and supplies the resultant first external input signal as the first input signal to the first input terminal; and a second voltage shift unit which is connected to a second external input terminal and the second input terminal, reduces a range of high to low levels of a second external input signal input from the second external input terminal, and supplies the resultant second external input signal as the second input signal to the second input terminal, wherein said differential amplifier unit comprises:
 a current source having one terminal connected to the first power supply terminal,
 a fifth MOSFET having a source connected to the other terminal of the current source and a gate connected to the first input terminal,
 a sixth MOSFET having a source connected to the other terminal of the current source and a gate connected to the second input terminal,
 a seventh MOSFET having a drain and gate connected to a drain of the fifth MOSFET and a source connected to the second power supply terminal, and
 an eighth MOSFET having a drain connected to a drain of the sixth MOSFET, a gate connected to the gate and drain of the seventh MOSFET, and a source connected to the second power supply terminal.

9. A differential amplifier circuit comprising:
a differential amplifier unit which has first and second input terminals and differentially amplifies first and second input signals respectively input to the first and second input terminals;

a first voltage shift unit which is connected to a first external input terminal and the first input terminal, reduces a range of high to low levels of a first external input signal input from the first external input terminal, and supplies the resultant first external input signal as the first input signal to the first input terminal; and a second voltage shift unit which is connected to a second external input terminal and the second input terminal, reduces a range of high to low levels of a second external input signal input from the second external input terminal, and supplies the resultant second external input signal as the second input signal to the second input terminal, wherein said differential amplifier unit comprises:
 a current source having one terminal connected to the first power supply terminal,
 a first bipolar transistor having an emitter connected to the other terminal of the current source and a base connected to the first input terminal,
 a second bipolar transistor having an emitter connected to the other terminal of the current source and a base connected to the second input terminal,
 a third bipolar transistor having a collector and base connected to a collector of the first bipolar transistor and an emitter connected to the second power supply terminal, and
 a fourth bipolar transistor having a collector connected to a collector of the second bipolar transistor, a base connected to the collector and base of the third bipolar transistor, and an emitter connected to the second power supply terminal.

10. A circuit according to claim 7, wherein said differential amplifier unit comprises
 a current source having one terminal connected to the first power supply terminal,
 a fifth MOSFET having a source connected to the other terminal of the current source, and a gate connected to the first input terminal,
 a sixth MOSFET having a source connected to the other terminal of the current source, and a gate connected to the second input terminal,
 a seventh MOSFET having a drain and gate connected to a drain of the fifth MOSFET, and a source connected to the second power supply terminal, and
 an eighth MOSFET having a drain connected to a drain of the sixth MOSFET, a gate connected to the gate and drain of the seventh MOSFET, and a source connected to the second power supply terminal.

11. A circuit according to claim 7, wherein said differential amplifier unit comprises
 a current source having one terminal connected to the first power supply terminal,
 a first bipolar transistor having an emitter connected to the other terminal of the current source, and a base connected to the first input terminal, a second bipolar transistor having an emitter connected to the other terminal of the current source, and a base connected to the second input terminal, a third bipolar transistor having a collector and base connected to a collector of the first bipolar transistor, and an emitter connected to the second power supply terminal, and a fourth bipolar transistor having a collector connected to a collector of the second bipolar transistor, a base connected to the collector and base of the third bipolar transistor, and an emitter connected to the second power supply terminal.

* * * * *